US009977074B2

United States Patent
Fujii

(10) Patent No.: US 9,977,074 B2
(45) Date of Patent: May 22, 2018

(54) SEMICONDUCTOR DEVICE, SEMICONDUCTOR APPARATUS AND METHOD FOR MANUFACTURING SEMICONDUCTOR DEVICE

(71) Applicant: SHINKO ELECTRIC INDUSTRIES CO., LTD., Nagano-shi, Nagano (JP)

(72) Inventor: Tomoharu Fujii, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 105 days.

(21) Appl. No.: 14/672,611

(22) Filed: Mar. 30, 2015

(65) Prior Publication Data

US 2015/0282325 A1  Oct. 1, 2015

(30) Foreign Application Priority Data

Mar. 31, 2014  (JP) .................. 2014-072410

(51) Int. Cl.
 *H05K 7/10* (2006.01)
 *H05K 7/12* (2006.01)
 (Continued)

(52) U.S. Cl.
 CPC .......... *G01R 31/2818* (2013.01); *H01L 24/97* (2013.01); *H05K 1/0268* (2013.01);
 (Continued)

(58) Field of Classification Search
 CPC ...... G01R 31/2818; H01L 2224/16225; H01L 24/97; H01L 2924/15192;
 (Continued)

(56) References Cited

U.S. PATENT DOCUMENTS

2002/0125879 A1* 9/2002 Lee .................. G01R 1/045
 324/756.05
2003/0101354 A1* 5/2003 Okabe ................ G06F 9/24
 726/34

(Continued)

FOREIGN PATENT DOCUMENTS

EP   1722617    11/2006
JP   61-81177    5/1986
 (Continued)

OTHER PUBLICATIONS

European Search Report dated Aug. 20, 2015, 12 pages.
Japanese Office Action dated Sep. 12, 2017, English translation included, 7 pages.

*Primary Examiner* — Yuriy Semenenko
(74) *Attorney, Agent, or Firm* — Rankin, Hill & Clark LLP

(57) ABSTRACT

A semiconductor device includes a board, an electronic component, an evaluation component, a wiring, and a groove portion. The board includes a product area, a non-product area, and a boundary area between the product area and the non-product area. The electronic component is mounted in the product area. The evaluation component is mounted in the non-product area. The wiring electrically connects the electronic component and the evaluation component. The groove portion is formed in the boundary area of the board so as to overlap at least a part of the wiring in a plan view. The non-product area is surrounded by the groove portion and at least a portion of sides of the board.

7 Claims, 10 Drawing Sheets

(51) Int. Cl.
*G01R 31/28* (2006.01)
*H05K 1/02* (2006.01)
*H05K 3/00* (2006.01)
*H01L 23/00* (2006.01)

(52) U.S. Cl.
CPC .. *H05K 3/0052* (2013.01); *H01L 2224/16225* (2013.01); *H01L 2924/15192* (2013.01); *H01L 2924/19105* (2013.01); *H05K 2201/09036* (2013.01); *H05K 2201/0989* (2013.01); *H05K 2201/09127* (2013.01); *H05K 2201/09972* (2013.01); *H05K 2203/175* (2013.01)

(58) Field of Classification Search
CPC ........ H01L 2924/19105; H05K 1/0268; H05K 2201/09036; H05K 2201/09127; H05K 2201/0989; H05K 2201/09972; H05K 2203/175; H05K 3/0052
See application file for complete search history.

(56) References Cited

U.S. PATENT DOCUMENTS

| | | |
|---|---|---|
| 2005/0064342 A1 | 3/2005 | Dohata |
| 2007/0019392 A1* | 1/2007 | Seifried .................. H05K 1/117 361/752 |
| 2008/0088028 A1 | 4/2008 | Chang et al. |
| 2008/0106288 A1* | 5/2008 | Rosenblatt .......... G01R 31/2818 324/754.03 |
| 2009/0121736 A1* | 5/2009 | Jenkins .............. G01R 31/2884 324/754.23 |
| 2011/0316170 A1* | 12/2011 | Muramatsu ....... H01L 23/49816 257/774 |
| 2013/0163249 A1 | 6/2013 | Miura |
| 2014/0268609 A1* | 9/2014 | Chien ................. H01L 23/3121 361/764 |

FOREIGN PATENT DOCUMENTS

| | | |
|---|---|---|
| JP | 63-131160 | 8/1988 |
| JP | 1-97575 | 6/1989 |
| JP | 07-297507 | 11/1995 |
| JP | 2002-164625 | 6/2002 |
| JP | 2002-357643 | 12/2002 |
| JP | 2005-72256 | 3/2005 |
| JP | 2005-332975 | 12/2005 |
| JP | 2007-134411 | 5/2007 |
| JP | 2012-59793 | 3/2012 |

* cited by examiner

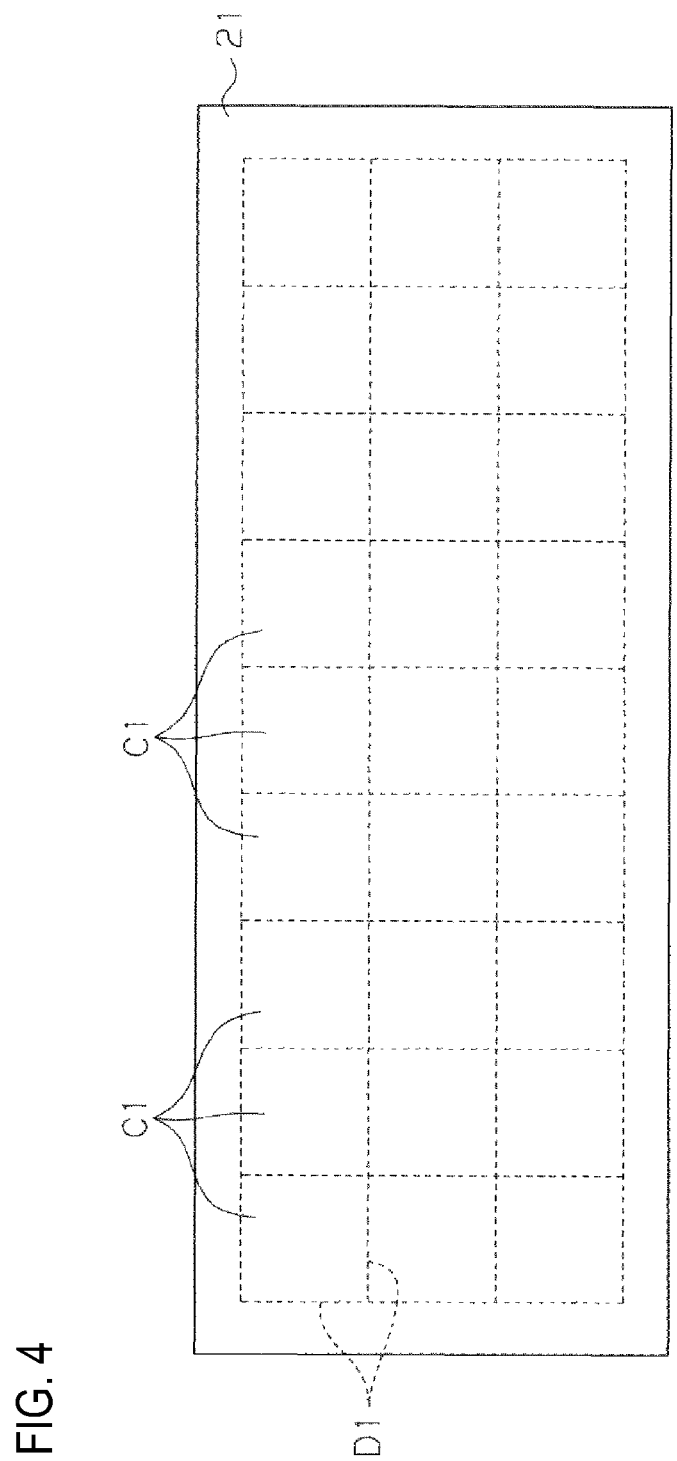

SEMICONDUCTOR DEVICE, SEMICONDUCTOR APPARATUS AND METHOD FOR MANUFACTURING SEMICONDUCTOR DEVICE

CROSS-REFERENCE TO RELATED APPLICATION(S)

This application claims priority from Japanese Patent Application No. 2014-072410, filed on Mar. 31, 2014, the entire contents of which are herein incorporated by reference.

BACKGROUND

Technical Field

Exemplary embodiments of the invention relate to a semiconductor device, a semiconductor apparatus, and a method for manufacturing a semiconductor device.

Related Art

With the recent demands to reduce the size of electronic apparatus and to enhance functionality of the electronic apparatus, semiconductor chips such as ICs and LSIs used therein have increased in integration density and capacity. Also, there arises another demand to reduce a size, a thickness and a density of semiconductor devices (packages) on which a semiconductor chip is mounted. To meet these demands, systems in package (SiPs) in which plural semiconductor chips are mounted on a single board have been put in practical use.

In such semiconductor devices, a connector to be used for writing firmware to a semiconductor chip mounted on a board and a connector to be used for evaluating the characteristics of the semiconductor device are provided on the board.

JP 2002-357643 A (corresponding to U.S. Pat. No. 6,762,615) relates to the art described above.

SUMMARY

The above described connectors are, however, larger in height than electronic components (such as semiconductor chips and chip components) mounted on a board. Thus, the connectors increase a size and a height of semiconductor devices. Also, once the semiconductor devices are manufactured, it has not been easy to remove the connectors which are one of causes to increase the size and height of the semiconductor devices.

According to one exemplary embodiment, a semiconductor device includes a board, an electronic component, an evaluation component, a wiring, and a groove portion. The board includes a product area, a non-product area, and a boundary area between the product area and the non-product area. The electronic component is mounted in the product area. The evaluation component is mounted in the non-product area. The wiring electrically connects the electronic component and the evaluation component. The groove portion is formed in the boundary area of the board so as to overlap at least a part of the wiring in a plan view. The non-product area is surrounded by the groove portion and at least a portion of sides of the board.

With the above configuration, even after the semiconductor device is manufactured or shipped, the evaluation component (for example, a connector) can be removed. The removal of the evaluation component makes it possible to reduce a size and a height of the semiconductor device.

BRIEF DESCRIPTION OF THE DRAWINGS

FIG. 4 is a schematic plan view illustrating a manufacturing process (part 1) according to the exemplary embodiment;

DETAILED DESCRIPTION

Exemplary embodiments of the invention will be hereinafter described with reference to the accompanying drawings. In order to facilitate understandings of some features, those features may be enlarged in the accompanying drawings. It should be noted that ratios between the dimensions of respective elements need not always be equal to actual ones. In sectional views, to facilitate understandings of respective members, those members may be drawn with dotted hatching instead of oblique-line hatching, and there may be members for which hatching is omitted.

First, the structure of a semiconductor device 10 according to one exemplary embodiment will be descried.

Figure 1:
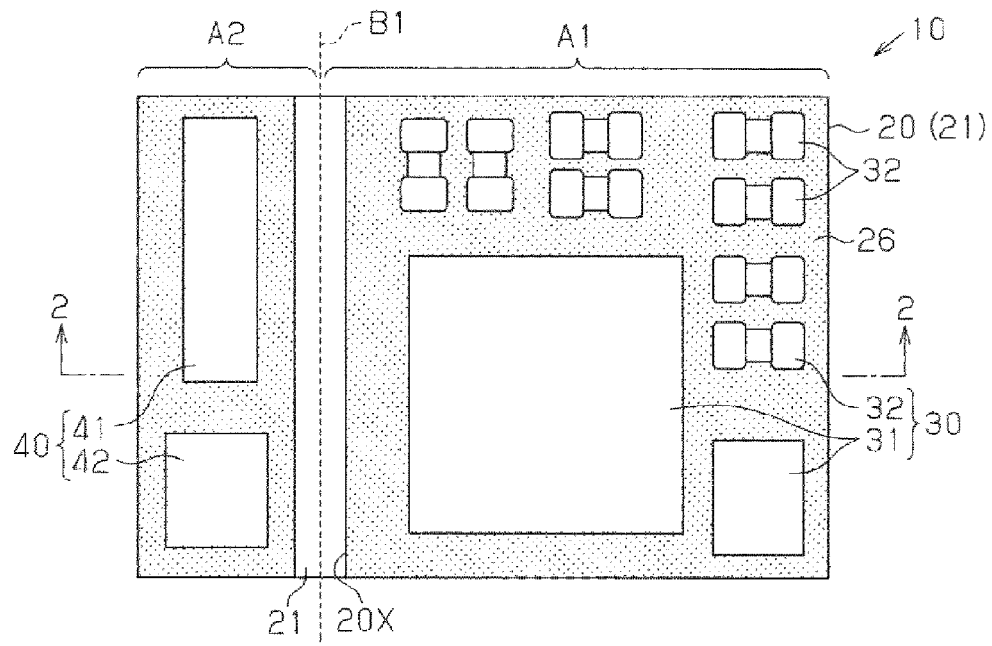
FIG. 1 is a schematic plan view of a semiconductor device according to an exemplary embodiment.

As shown in FIG. 1, the semiconductor device 10 includes a wiring board 20. The wiring board 20 may have any desired shape in a plan view. For example, the wiring board 20 has an approximately rectangular shape in a plan view.

The wiring board 20 has a product area A1 and a non-product area A2. One or plural (in FIG. 1, ten) electronic components 30 are mounted on an upper surface of the wiring board 20 in the product area A1. The electronic components 30 are, for example, connected to pads P1 (see FIG. 2) of the wiring board 20. The electronic components 30 include electronic components 31, 32. The electronic components 31 are, for example, semiconductor integrated circuits (LSIs). The electronic components 32 are, for example, chip components. Examples of the chip components include a chip resistor, a chip capacitor, and a chip inductor. There are no particular limitations on the number of electronic components 30 mounted on the wiring board 20 and a ratio between the number of electronic components 31 and that of electronic components 32. Those numbers and the ratio may be varied (increased or decreased) desirably.

For example, where the semiconductor device 10 is a wireless communication module, an RFIC (radio frequency integrated circuit), an MCU (microcontroller unit), a quartz oscillator, capacitors, an antenna for wireless communication and other purposes, etc. are mounted on the wiring board 20 as the electronic components 30.

One or plural (in FIG. 1, two) evaluation components 40 are mounted on the upper surface of the wiring board 20 in the non-product area A2. The evaluation components 40 are connected to, for example, pads P2 of the wiring board 20. The evaluation components 40 include a connector 41 and an evaluation terminal 42. The connector 41 is, for example, a connector to be used in writing a program (information) such as firmware to the electronic components 31. For example, a program writer (not shown) for writing program such as firmware is connected to the connector 41. More specifically, a counterpart connector (not shown) that is electrically connected to the program writer is connected to the connector 41. Also, the evaluation terminal 42 is, for example, an evaluation connector or evaluation pads (in FIG. 1, evaluation connector) to be used for evaluating the electrical characteristics of the semiconductor device 10 (for performing electrical tests on the semiconductor device 10). For example, a semiconductor tester (not shown) is connected to the evaluation terminal 42. More specifically, where the evaluation terminal 42 is an evaluation connector, a counterpart connector (not shown), for example, that is electrically connected to the semiconductor tester is connected to the evaluation connector. Where the evaluation terminal 42 is evaluation pads, test terminals (not shown), for example, of the semiconductor tester are connected to the evaluation pads. The connector 41 and the evaluation terminal 42 are tall components that are larger in height than the electronic components 30.

In this specification, it is assumed that the evaluation components 40 include a connector 41 for writing program (firmware).

The product area A1 and the non-product area A2 may have any shapes in a plan view. For example, the product area A1 may have an approximately rectangular shape in a plan view, and the non-product area A2 may have an approximately rectangular shape. For example, the non-product area A2 is an area that is surrounded by (i) a boundary line B1 (indicated by a broken line) between the product area A1 and the non-product area A2 and (ii) sides, located outside the product area A1 (in FIG. 1, located on the left side), of the wiring board 20. The wiring board 20 is formed with a groove portion 20X in an area (hereinafter referred to as a "boundary area") around the boundary line B1. Therefore, it can also be said that the non-product area A2 is an area that is surrounded by (i) the groove portion 20X and (ii) portions of the sides of the wiring board 20. That is, at least one (in FIG. 1, three) of the plural (in FIG. 1, four) sides that define the external shape of the non-product area A2 is defined by a portion(s) of the sides of the wiring board 20, and the remaining side(s) (in FIG. 1, the single side) is defined by the groove portion 20X.

Figure 2:
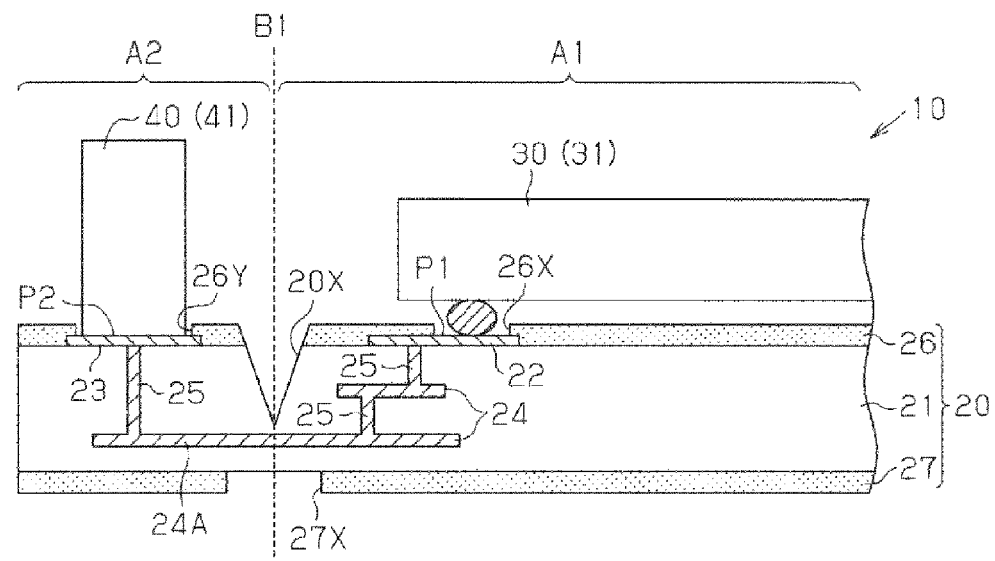
FIG. 2 is a schematic sectional view, taken along a line 2-2 in FIG. 1, of the semiconductor device according to the exemplary embodiment.

As shown in FIG. 2, the wiring board 20 includes a board 21, uppermost wiring patterns 22, 23, internal-layer wirings 24 which are formed inside the board 21, and solder resist layers 26, 27.

The wiring patterns 22, 23 are laminated on the upper surface of the board 21. The wiring pattern 22 is formed in the product area A1. The wiring pattern 23 is formed in the non-product area A2. The wiring patterns 22, 23 may be made of copper (Cu), a copper alloy, or the like.

The solder resist layer 26 is laminated on the upper surface of the board 21 so as to partially cover the wiring patterns 22, 23. The solder resist layer 26 may be made of an insulation resin such as an epoxy resin or an acrylic resin. The solder resist layer 26 is formed with opening portions 26X, 26Y. The opening portion 26X is formed so that a portion of the wiring pattern 22 is exposed to serve as the pads P1. The opening portion 26Y is formed so that a portion of the wiring pattern 23 is exposed to serve as the pads P2. The pad P1 serves as an electronic component mounting pad for electric connection to the electronic component 30 (electronic components 31, 32). The pad P2 serves as a pad for electric connection to the evaluation component 40 (connector 41 and evaluation terminal 42). Where the evaluation terminal 42 is an evaluation pad, the pad P2 itself function as the evaluation terminal 42.

When necessary, surface treatment layers may be formed on the portions, exposed through the opening portions 26X, 26Y, of the wiring patterns 22, 23. Examples of the surface treatment layers include a gold (Au) layer, a nickel (Ni)/Au layer (a metal layer in which an Ni layer and an Au layer are laminated in this order), an Ni/palladium (Pd)/Au layer (a metal layer in which an Ni layer, a Pd layer, and an Au layer are laminated in this order). Each of those Ni layer, Au layer, and Pd layer may be a metal layer formed by electroless plating (electroless plating metal layer). Also, the Au layer is a metal layer made of Au or an Au alloy, the Ni layer is a metal layer made of Ni or an Ni alloy, and the Pd layer is a metal layer made of Pd or a Pd alloy. The surface treatment layers may be formed on the portions, exposed through the opening portions 26X, 26Y, of the wiring patterns 22, 23 by performing antioxidation treatment such as OSP (organic solderability preservative).

In the semiconductor device 10, the electronic components 30 are mounted on the pads P1, and the evaluation components 40 are mounted on the pads P2. Thereby, the electronic components 30 are electrically connected to the wiring patterns 22, and the evaluation components 40 are electrically connected to the wiring patterns 23. There are no particular limitations on a method for mounting the electronic components 30 and the evaluation components 40. The electronic components 30 and the evaluation components 40 may be mounted on the wiring board 20 by solder mounting, wire bonding, flip-chip mounting, or the like. In the example of FIG. 2, the electronic components 31 are mounted on the pads P1 by flip-chip mounting, and the connector 41 is mounted on the pads P2 by solder mounting.

The board 21 has such a structure that the wiring pattern 22 (pad P1) and the wiring pattern 23 (pad P2) are electrically connected to each other. That is, a wiring that electrically connects the wiring pattern 22 (pad P1) and the wiring pattern 23 (pad P2) is formed in the board 21. For example, the internal-layer wirings 24 that electrically connect the pad P1 and the pad P2 are formed inside the board 21. For example, plural internal-layer wirings 24 are laminated via interlayer insulating layers (not shown). The wiring patterns 22, 23 are electrically connected to each other by the respective internal-layer wirings 24 and vias 25 formed in the respective insulating layers. Thereby, the pads P1, P2 are electrically connected to each other. As a result, the electronic components 30 are electrically connected to the evaluation components 40 through the wiring patterns 22, the internal-layer wirings 24, and the wiring patterns 23.

The internal-layer wirings 24 include a wiring 24A that spans the product area A1 and the non-product area A2. That is, the internal-layer wirings 24 include the wiring 24A that goes across the boundary line B1 between the product area A1 and the non-product area A2.

FIG. 2 only shows the internal-layer wirings 24 that electrically connects the wiring pattern 22 to the wiring pattern 23. However, internal-layer wirings which electrically connects the wiring patterns 23 to each other are also formed inside the board 21. Furthermore, where a wiring pattern is formed on the lower surface of the board 21, an internal-layer wiring that electrically connects the lowermost wiring pattern to the uppermost wiring pattern 23 is also formed inside the board 21.

The board 21 may be, for example, a cored build-up board having a core substrate or a coreless board having no core substrate.

A solder resist layer 27 is laminated on the lower surface of the board 21. For example, the solder resist layer 27 is formed so as to cover a lowermost wiring pattern (not shown). The solder resist layer 27 may be made of an insulation resin such as an epoxy resin or an acrylic resin. An opening portion 27X is formed in the boundary area between the product area A1 and the non-product area A2 so as to pass through the solder resist layer 27 in a thickness direction thereof. The opening portion 27X is formed, for example, so as to expose a portion, in the boundary area, of the lower surface of the board 21.

The above-described wiring board 20 is formed with the groove portion 20X in the boundary area between the product area A1 and the non-product area A2. The groove portion 20X passes through the solder resist layer 26 in the thickness direction thereof. The groove portion 20X extends from the upper surface of the solder resist layer 26 to a midway position, in the thickness direction, in the board 21. That is, a bottom surface of the groove portion 20X is located at the midway position, in the thickness direction, in the board 21. The groove portion 20X is formed at such a position where the groove portion 20X overlaps a part of the internal-layer wiring 24 in a plan view. More specifically, the groove portion 20X is formed at such a position where the groove portion 20X overlaps a part of the inter-layer wiring 24A that goes across the boundary line B1, in a plan view. Also, the groove portion 20X is formed at such a position where the groove portion 20X overlaps the opening portion 27X of the solder resist layer 27 in a plan view. In other words, the opening portion 27X of the solder resist layer 27 is formed at such a position where the opening portion 27X overlaps the groove portion 20X in a plan view. It is preferable that a depth of the groove portion 20X in the board 21 be about 25% to about 75% (more preferably about 50% to about 75%) of the entire thickness of the board 21. It should be noted that the depth of the groove portion 20X is set so that the groove portion 20X does not interfere with the internal-layer wiring 24A. Because of the presence of the groove portion 20X, the wiring board 20 becomes thin in the boundary area.

The groove portion 20X may have any sectional shape. In the example of FIGS. 1 and 2, the groove portion 20X has an approximately V shape in cross section. More specifically, the groove portion 20X is tapered in such a manner that a width of the groove portion 20X increases from the lower side (bottom surface) to the upper side (solder resist layer 26 side). Therefore, the inner wall surfaces of the groove portion 20X are inclined with respect to the upper surface of the board 21. For example, the groove portion 20X is generally shaped like a triangular prism. As shown in FIG. 1, the groove portion 20X has, for example, a substantially band shape or a substantially rectangle shape in a plan view. In the example of FIGS. 1 and 2, the groove portion 20X is parallel to two sides (in FIG. 1, the left and right sides) of the four sides of the board 21 that define an external shape of the board 21 in a plan view. Also, the groove portion 20X is perpendicular to the other two sides (in FIG. 1, the upper and lower sides). In the example of FIGS. 1 and 2, one end of the groove portion 20X in a longitudinal direction of the groove portion 20X coincides with a portion of the upper side of the board 21, and the other end of the groove portion 20X coincides with a portion of the lower side of the board 21.

Figure 3A:
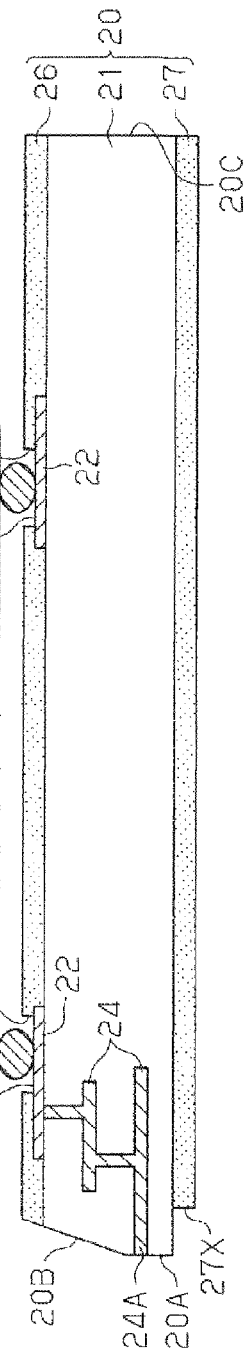
FIGS. 3A and 3B are schematic sectional views of the semiconductor devices after cutting.

FIG. 3A shows a semiconductor device 10A after the board 21 and the internal-layer wiring 24 are cut at the boundary line B1 which is indicated by the broken line in FIG. 2. In the semiconductor device 10A (wiring board 20) after the cutting, a part of the internal-layer wiring 24 (more specifically, the wiring 24A) is exposed from one outer side surface 20A which includes a cutting surface. The outer side surface 20A also includes a slant surface 20B. More specifically, the outer side surface 20A includes the slant surface 20B which is inclined upwards from a midway position, in the thickness direction, of the outer side surface 20A toward the inside of the semiconductor device 10A (wiring board 20). That is, in the semiconductor device 10A, a surface of the groove portion 20X which was one inner wall surface thereof before the cutting remains as the slant surface 20B. Also, one outer side surface of the solder resist layer 27 is formed at a receded position from the outer side surface 20A to the inside of the wiring board 20. Therefore, a portion, near the outer side surface 20A, of the lower surface of the board 21 is exposed from the solder resist layer 27. An outer side surface 20C, opposed to the outer side surface 20A, of the semiconductor device 10A (wiring board 20) after the cutting includes an outer side surface of the board 21 and outer side surfaces of the solder resist layers 26, 27 which are approximately flush with each other.

The semiconductor device 10A after the cutting may be used upside down and disposed at any angle.

Next, description will be given on how the semiconductor device 10 works.

The groove portion 20X is formed in the boundary area between the product area A1 and the non-product area A2. The evaluation components 40 are mounted in the non-product area A2 which is surrounded by the groove portion 20X and portions of the sides of the board 21. Therefore, the wiring board 20 is thin in the boundary area because of the presence of the groove portion 20X. Thus, it is easy to cut the wiring board 20 (that is, to remove the non-product area A2). The removal of the non-product area A2 removes the evaluation components 40 which are tall components from the semiconductor device 10A.

Figure 3B:
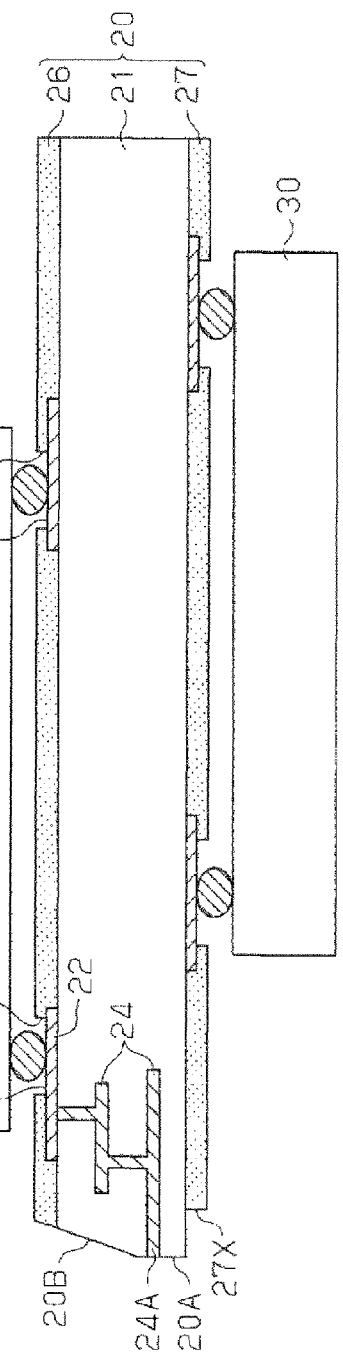

The groove portion 20X has an approximately V shape in cross section. Thereby, the one outer side surface 20A of the semiconductor device 10A after the cutting is given the slant surface 20B. By virtue of the slant surface 20B, even if the cutting of the wiring board 20 including the inter-layer wiring 24 causes sagging of the internal-layer wiring 24, it can be well suppressed that a wiring pattern 22 or an electronic component 30 is short-circuited with the sagging portion of the internal-layer wiring 24. Furthermore, the slant surface 20B makes it possible for a worker to easily discriminate the upper surface and lower surface of the semiconductor device 10A from each other. For example, even in a case where as shown in FIG. 3B, an electronic component 30 is also mounted on the lower surface of the wiring board 20, the slant surface 20B makes it possible for a worker to easily discriminate the upper surface and the lower surface of the semiconductor device 10A from each other.

Next, description will be given on a method for manufacturing the semiconductor device 10. For convenience of description, members, layers, etc. to finally become constituent elements of the semiconductor device 10 will be given the reference symbols of the constituent elements.

Figure 5A:
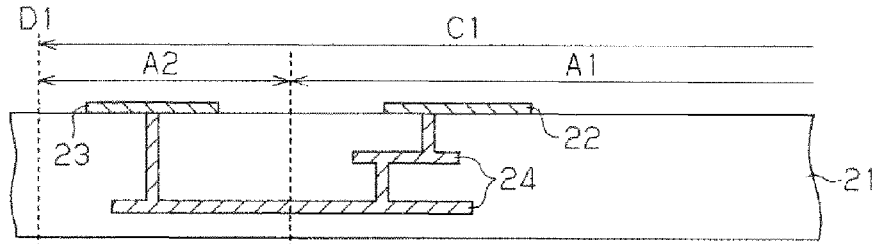
FIGS. 5A to 5D are schematic sectional views illustrating the manufacturing process (part 2) according to the exemplary embodiment.

At first, in a step shown in FIGS. 4 and 5A, a board 21 is prepared. The board 21 is, for example, a flat plate having a approximately rectangle shape in a plan view as shown in FIG. 4. The board 21 is a large-size board from which a large number of wiring boards 20 (semiconductor devices 10) can be produced. More specifically, individual areas C1 in which structural bodies corresponding to respective semiconductor devices 10 are to be formed are arranged in the board 21 in a matrix form (in FIG. 4, 9×3). The large-size board 21 is finally cut along cutting lines D1 (indicated by broken lines) by a dicing blade or the like to obtain the respective semiconductor devices 10. For the sake of convenience, FIGS. 5A to 6C show the structure of a single individual area C1.

A structural body shown in FIG. 5A is formed in each individual area 5A. That is, a board 21, wiring patterns 22, 23 formed on an upper surface of the board 21, and internal-layer wirings 24 formed inside the board 21 are formed in each individual area C1. A method for manufacturing this structural body is not described here because it can be manufactured by a known manufacturing method (for example, the build-up method). That is, in the step shown in FIGS. 4 and 5A, the internal-layer wirings 24 are formed inside the board 21 in each individual area C1 by a known manufacturing method, and the wiring patterns 22, 23 are formed on the upper surface of the board 21 so as to be connected to the internal-layer wirings 24 by a known manufacturing method. A product area A1 and a non-product area A2 are defined in each individual area C1. In FIG. 5A, a boundary line B1 between the product area A1 and the non-product area A2 is indicated by a broken line.

Figure 5B:
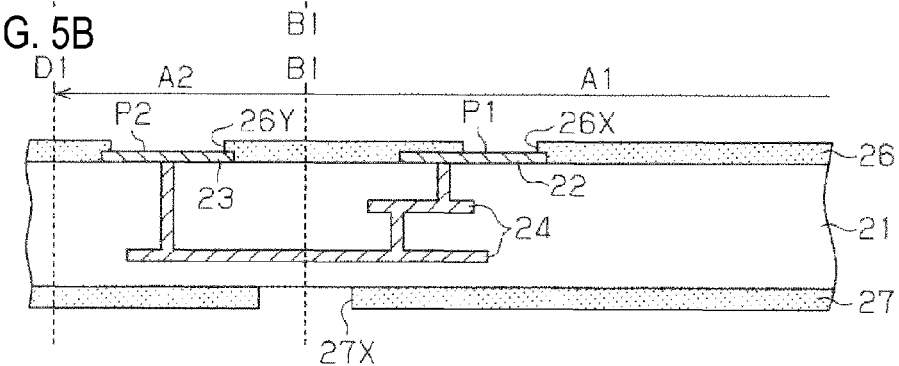

In a next step shown in FIG. 5B, a solder resist layer 26 formed with opening portions 26X, 26Y is laminated on the upper surface of the board 21. A portion of the wiring pattern 22 is exposed through the opening portion 26X as a pad P1. A portion of the wiring pattern 23 is exposed through the opening portion 26Y as a pad P2. Also, a solder resist layer 27 formed with an opening portion 27X is laminated on the lower surface of the board 21. A portion of the lower surface of the board 21 is exposed through the opening portion 27X in the boundary area between the product area A1 and the non-product area A2. The solder resist layers 26, 27 may be formed by the following method. That is, a photosensitive solder resist film is laminated or a liquid solder resist layer is applied. Then, the photosensitive solder resist film or the applied solder resist layer is patterned into a prescribed shape. If necessary, surface treatment layers may be formed on the pads P1 and P2.

Figure 5C:
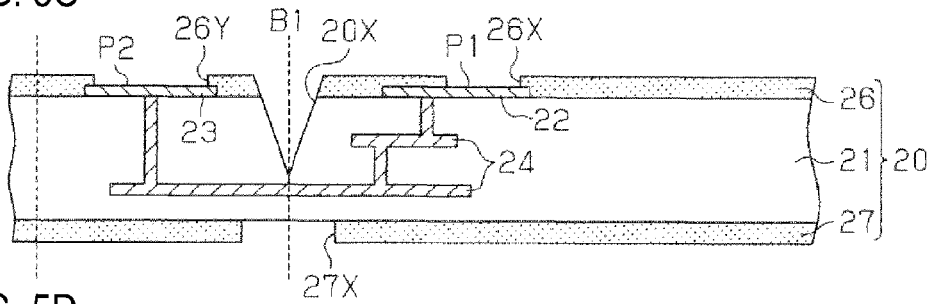

In a next step shown in FIG. 5C, a groove portion 20X is formed by, for example, polishing away portions, located on the boundary line B1 and in a peripheral region of the boundary line B1, of the solder resist layer 26 and board 21 from the upper surface of the solder resist layer 26 to a vicinity of a center of the board 21 in the thickness direction thereof. In an example of FIG. 5C, the groove portion 20X is formed so as to have an approximately V shape in cross section. The groove portion 20X may be formed by means of a dicer, a router, laser processing, die pressing, or the like.

Figure 5D:
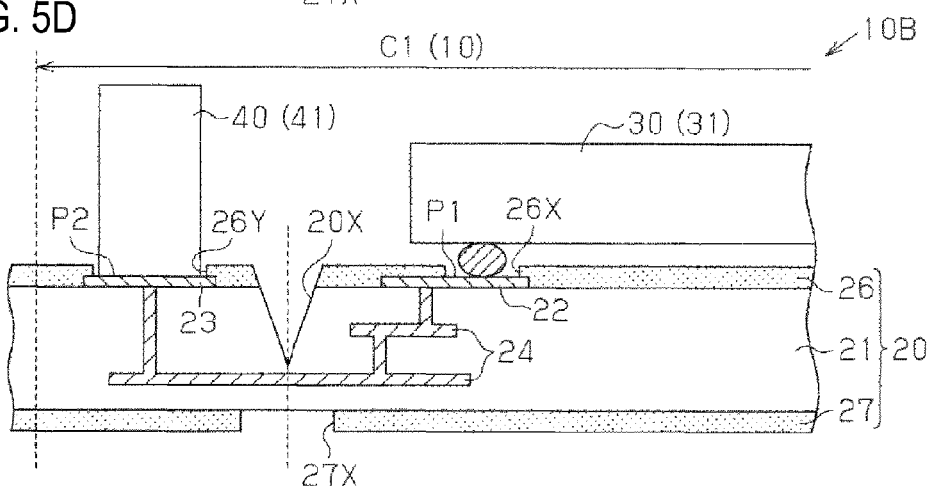

In a next step shown in FIG. 5D, electronic components 30 (electronic components 31, 32) are mounted on the pads P1, and evaluation components 40 (connector 41 and evaluation terminal 42) are mounted on the pads P2. A structural body corresponding to a semiconductor device 10 is formed in each individual area C1 by the above-described manufacturing process. As a result, a sheet-like semiconductor device 10B having the plural individual areas C1 in which the structural bodies corresponding to the respective semiconductor devices 10 are formed is obtained. The sheet-like semiconductor device 10B may be shipped as a product without the remaining part of the manufacturing process described below be executed.

Figure 6A:
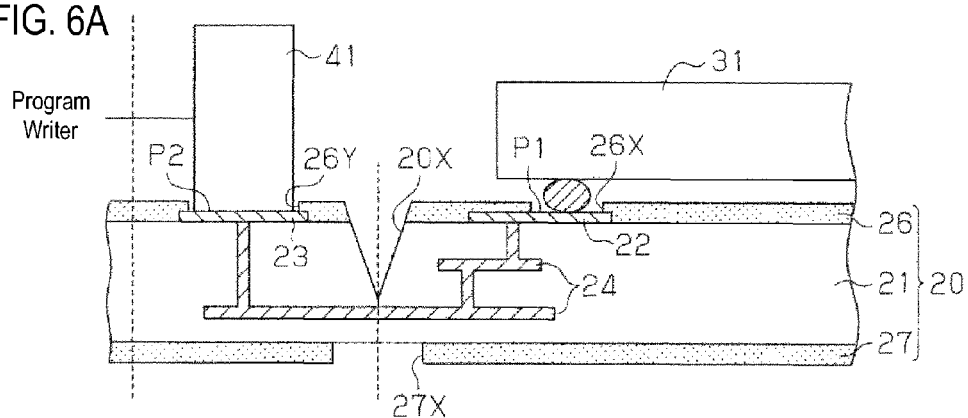
FIGS. 6A to 6C are schematic sectional views illustrating the manufacturing process (part 3) according to the exemplary embodiment.

In a next step shown in FIG. 6A, a program writer (information writer) is connected to the connector 41. Then, firmware (information) is written to the electronic components 31 using the program writer. More specifically, the firmware is written into a ROM (read-only memory) of the electronic component 31 using the program writer and the connector 41.

Figure 6B:
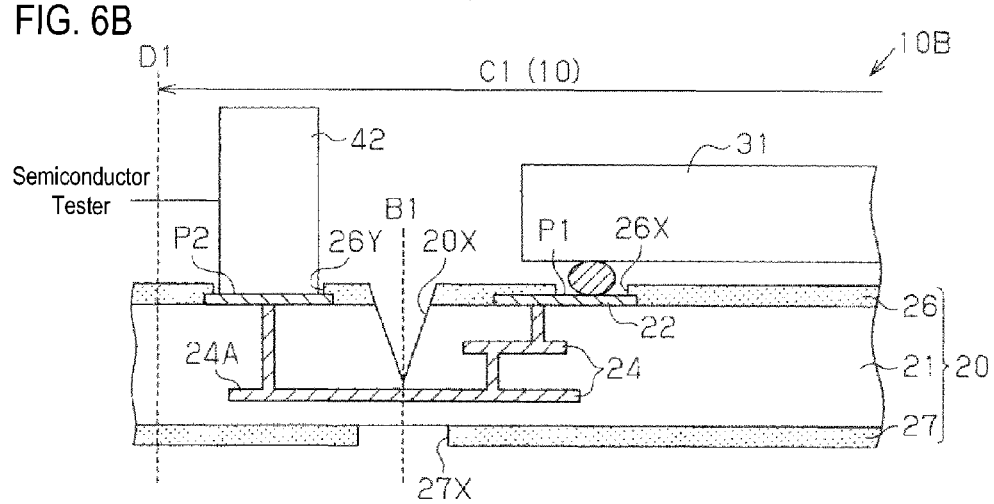

In a next step shown in FIG. 6B, a semiconductor tester is connected to the evaluation terminal 42. Then, the electrical characteristics of the semiconductor device 10 formed in each individual area C1 are evaluated using the semiconductor tester. For example, an operation of the semiconductor device 10 formed in each individual area C1 is checked by performing electrical tests for the semiconductor device 10 using the semiconductor tester and the evaluation terminal 42.

An order of (i) execution of the firmware writing step shown in FIG. 6A and (ii) execution of the characteristics evaluation step shown in FIG. 6B is not limited to the above. For example, the characteristics evaluation step shown in FIG. 6B may be executed first, and thereafter the firmware writing step shown in FIG. 6A may be executed.

The steps shown in FIGS. 5D to 6B (that is, the mounting step, the firmware writing step, and the characteristics evaluation step) may be executed after the sheet-like semiconductor device 10B having the 9×3 individual areas C1 is divided into band-like semiconductor devices each having a 9×1 individual areas C1, for example.

Figure 6C:
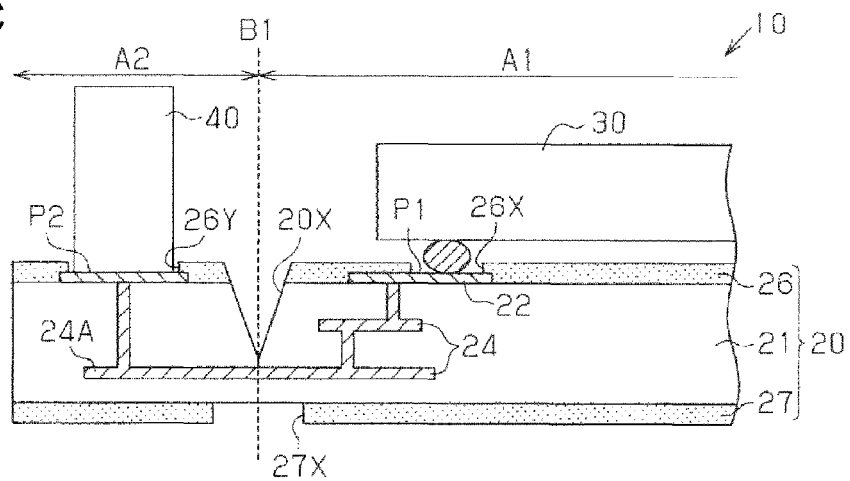

Subsequently, the structural body shown in FIG. 6B is cut along the cutting lines D1 using a dicing blade or the like. That is, the sheet-like semiconductor device 10B is cut into the individual areas C1. As a result, the individual semiconductor device 10 as shown in FIGS. 2 and 6C is obtained. The steps shown in FIGS. 5D to 6B (i.e., the mounting step, the firmware writing step, and the characteristics evaluation step) may be executed after the individual semiconductor devices 10 are obtained.

Then, each semiconductor device 10 (that is, the board 21 including the internal-layer wirings 24) is cut at the boundary line B1 which is indicated by the broken line in FIG. 6C. That is, the wiring board 20 is separated at the groove portion 20X into the product area A1 and the non-product area A2. As a result, the non-product area A2 is removed from each semiconductor device 10, a part of the internal-layer wirings 24 are exposed from one outer side surface 20A of the semiconductor device 10, and the outer side surface 20A is given a slant surface 20B (see FIG. 3A). In this step, for example, the board 21 may be cut by applying a weight to the non-product area A2 from the upper surface side where the groove portion 20X is formed in a state that the product area A1 is fixed. The wiring board 20 is made thin in the boundary area serving as the cutting position because of the presence of the groove portion 20X. Therefore, the semiconductor device 10 can be cut (divided) there easily by the above method. Also, the solder layer 27 which is laminated on the lower surface of the board 21 is formed with the opening portion 27X at such a position that the opening portion 27X overlaps the groove portion 20X in a plan view. Therefore, no part of the solder resist layer 27 is formed at the cutting position, and a portion of the solder resist layer 27 formed in the product area A1 and a portion of the solder resist layer 27 formed in the non-product area A2 are separated by the opening portion 27X. This structure well suppresses that the portion of the solder resist layer 27 formed in the non-product area A2 is peeled off together with the portion of the solder resist layer 27 formed in the product area A1, even in a case where the wiring board 20 is cut by applying a weight to the non-product area A2 instead of using a dicer, a router, or the like.

As described above, after a program such as firmware is written to the electronic components 31 and the characteristics of the semiconductor device 10 are evaluated, the non-product area A2 which is mounted with the evaluation components 40 which were used in writing of the firmware and evaluation of the characteristics is removed.

The above-described exemplary embodiment provides the following advantages:

(1) The groove portion 20X is formed in the boundary area between the product area A1 and the non-product area A2. The evaluation components 40 are mounted in the non-product area A2 which is surrounded by the groove portion 20X and a portion(s) of the sides of the board 21. With this configuration, the wiring board 20 is thin in the boundary area because of the presence of the groove portion 20X. Hence, the wiring board 20 can be easily cut in the boundary area. The removal of the portion in the non-product area A2 removes the evaluation components 40 which are tall components from the semiconductor device 10A. As a result, the semiconductor device 10A is small and thin as a whole.

(2) Incidentally, if mechanical processing using a dicer, a router, or the like is performed after the electronic components 30 are mounted on the wiring board 20 (that is, after completion of the semiconductor device 10), processing waste may stick to the electronic components 30.

In this connection, in the exemplary embodiment, the groove portion 20X is formed in advance before the electronic components 30 are mounted. The wiring board 20 is cut at the position that is included in the groove portion 20X after mounting of the electronic components 30, writing of firmware, and evaluation of the characteristics. Since the wiring board 20 is thin at the cutting position because of the presence of the groove portion 20X, the wiring board 20 can be cut (divided) there easily by a simple method of applying a weight to the non-product area A2 of the semiconductor device 10 from the upper surface side in a state where the product area A1 is fixed. As a result, it is not necessary to perform mechanical processing using a dicer, a router, or the like. Hence, it can be suppressed that processing waste that would otherwise be produced sticks to the electronic components 30. Furthermore, since the wiring board 20 can be cut by the simple method, the equipment cost can be reduced, that is, increase of the manufacturing cost can be suppressed.

(3) The non-product area A2 in which the evaluation components 40 are mounted has been removed in the final product. By virtue of this measure, even if a large-sized connector is used as an evaluation component 40, the evaluation component 40 does not increase the height or size of the semiconductor device 10A that no longer has the non-product area A2. This makes it possible to use a large-sized connector as an evaluation component 40. As a result, a counterpart connector that is connected to a program writer or a semiconductor tester can easily be connected to the evaluation component 40 (e.g., a connector).

(4) The groove portion 20X has an approximately V shape in cross section. With this configuration, the one outer side surface 20A of the semiconductor device 10A after the cutting is given the slant surface 20B. By virtue of the slant surface 20B, even if the cutting of the wiring board 20 including the inter-layer wiring 24 causes sagging of the internal-layer wiring 24, it can be well suppressed that the wiring pattern 22 or the electronic component 30 is short-circuited with the sagging portion of the internal-layer wiring 24.

(5) Furthermore, a worker can easily discriminate the upper and lower surfaces of the semiconductor device 10A from each other by recognizing the slant surface 20B.

(6) In the wiring board 20, the solder resist layer 27 is formed on the lower surface that is opposed to the upper surface formed with the groove portion 20X. The solder resist layer 27 is formed with the opening portion 27X at such a position that the opening portion 27X overlaps the groove portion 20X in a plan view. This configuration well suppresses that a portion of the solder resist layer 27 formed in the non-product area A2 is peeled off together with the portion of the solder resist layer 27 formed in the product area A1, even in a case where the wiring board 20 is cut by applying a weight to the non-product area A2 instead of using a dicer, a router, or the like.

(7) The wiring pattern 22 (pad P1) is electrically connected to the wiring pattern 23 (pad P2) only by the internal-layer wiring 24 and the via 25 which are formed inside the board 21. Therefore, none of the wirings that electrically connect the pad P1 and the pad P2 are exposed from the board 21. This configuration well suppresses, for example, that a wiring 24A that bypasses the groove portion 20X so as not to interfere with the groove portion 20X is short-circuited with another metal layer.

MODIFICATION EXAMPLES

The above-described exemplary embodiment may be modified in various manners as exemplified below.

In the exemplary embodiment, the pad P1 is electrically connected to the pad P2 only by the internal-layer wiring 24 and the vias 25 which are formed inside the board 21. The wiring that electrically connects the pad P1 and the pad P2 is not limited thereto.

Figure 7:
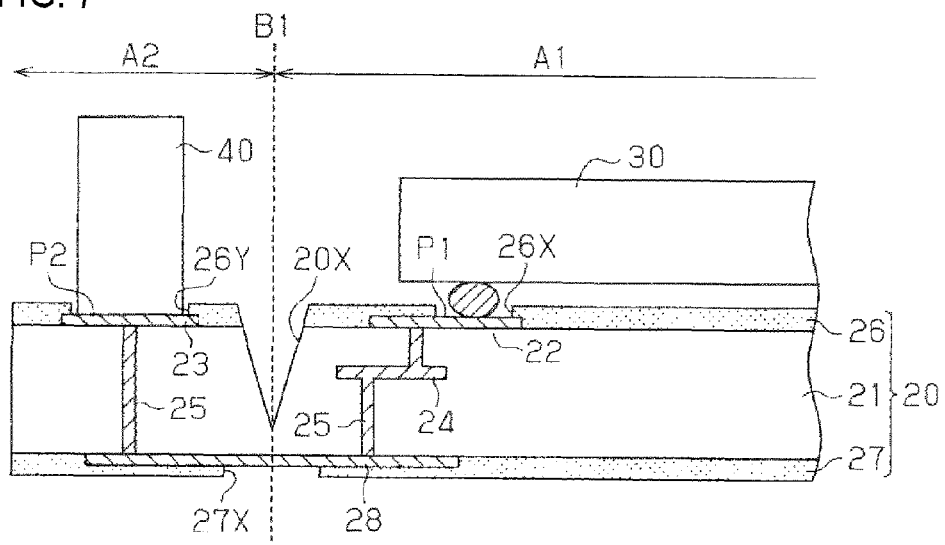
FIG. 7 is a schematic sectional view of a semiconductor device according to a first modification example.

For example, as shown in FIG. 7, the pad P1 may be electrically connected to the pad P2 by an internal-layer wiring 24, vias 25, and a wiring pattern 28. The wiring pattern 28 is formed on the lower surface of the board 21. In the example of FIG. 7, the wiring pattern 28 spans the product area A1 and the non-product area A2. That is, the wiring pattern 28 that bypasses the groove portion 20X so as not to interfere with the groove portion 20X is partially exposed from the board 21. In other words, the wiring pattern 28 is formed on the lower surface of the board 21 which is opposed to the upper surface of the board 21 which is formed with the groove portion 20X, so as to overlap the groove portion 20X in a plan view. Therefore, as shown in FIG. 7, the groove portion 20X can be formed so as to be deeper than in the exemplary embodiment. As a result, the wiring board 20 can be made thin in the boundary area satisfactorily. In this modification example, the opening portion 27X is formed through the solder resist layer 27 so as to expose a portion, in the boundary area, of the lower surface of the wiring pattern 28.

Figure 8:
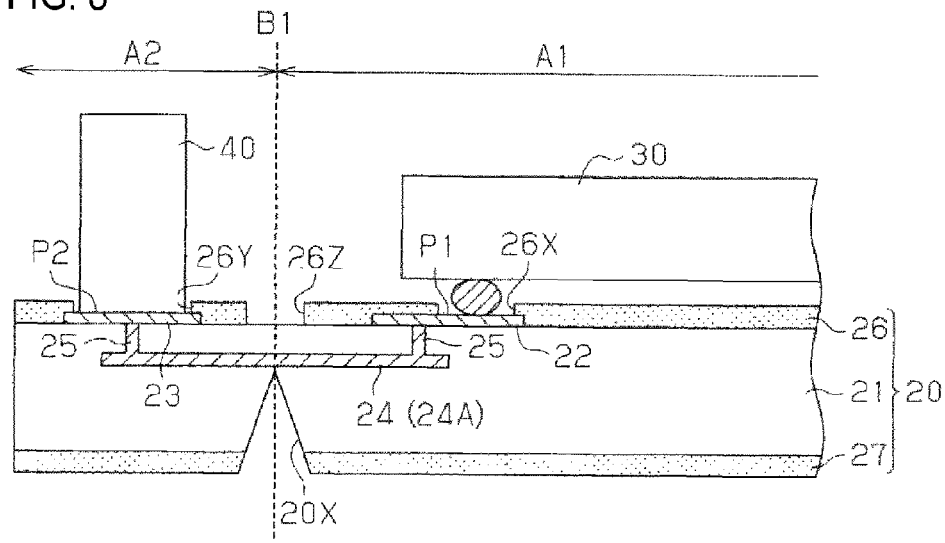
FIG. 8 is a schematic sectional view of a semiconductor device according to a second modification example.
Figure 9:
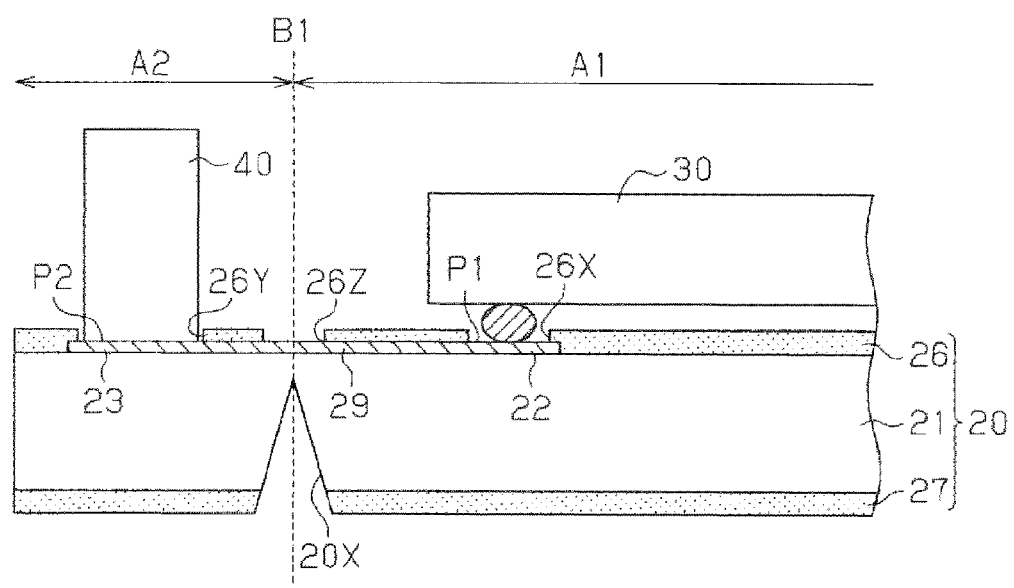
FIG. 9 is a schematic sectional view of a semiconductor device according to a third modification example.

In the exemplary embodiment, the upper surface of the wiring board 20 is formed with the groove portion 20X. The invention is, however, not limited thereto. As shown in FIGS. 8 and 9, the lower surface of the wiring board 20 may be formed with the groove portion 20X. This groove portion 20X passes through the solder resist layer 27 and extends into a midway position of the board 21 in the thickness direction of the board 21.

In the modification example shown in FIG. 8, the pad P1 is electrically connected to the pads P2 only by the internal-layer wiring 24 and the vias 25. In this case, the groove portion 20X is formed so as to overlap a portion of the internal-layer wiring 24 (more specifically, the internal-layer wiring 24A that spans the product area A1 and the non-product area A2) in a plan view. An opening 26Z is formed to passes through the solder resist layer 26 in the thickness direction of the solder resist layer 26. The opening portion 26Z overlaps the groove portion 20X in a plan view. A portion of the upper surface of the board 21 is exposed through the opening portion 26Z. This modification example having the above-described structure provides the same advantages as the advantages (1) to (7) of the exemplary embodiment. In addition, the wiring that electrically connects the pad P1 and the pad P2 can be made shorter.

Also, in the modification example shown in FIG. 9, the lower surface of the wiring board 20 is formed with the groove portion 20X. The pad P1 may be electrically connected to the pad P2 only by a wiring pattern 29. The wiring pattern 29 is formed on the upper surface of the board 21. In this case, the groove portion 20X is formed so as to overlap the wiring patterns 29 in a plan view. An opening portion 26Z passes through the solder resist layer 26 in the thickness direction of the solder resist layer 26. The opening portion 26Z overlaps the groove portion 20X in a plan view. A portion of the upper surface of the wiring pattern 29 is exposed through the opening portion 26Z. This modification example having the above-described structure provides the same advantages as the advantages (1) to (6) of the exemplary embodiment. In addition, the groove portion 20X can be made deeper than in the exemplary embodiment. The wiring that electrically connects the pad P1 and the pad P2 can be made shorter.

Figure 10A:
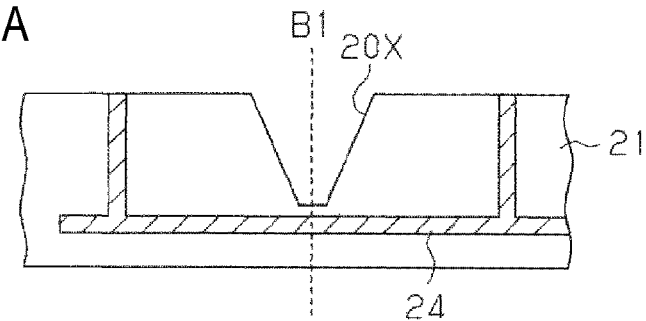
FIGS. 10A to 10C are schematic sectional views showing grooves employed in fourth to sixth modification examples.
Figure 10B:
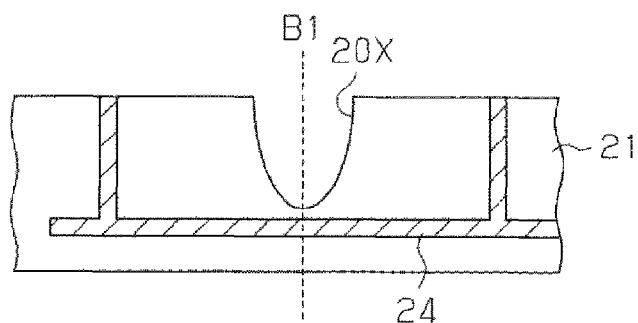

The sectional shape of the groove portion 20X is not limited to that employed in the exemplary embodiment and the above modification examples. For example, FIG. 10A shows a groove portion 20X having an approximately trapezoidal shape in cross section (a bottom side of the groove portion 20X is shorter than an opposed side to the bottom side). FIG. 10B shows a groove portion 20X having an approximately U shape in cross section. In either case, the groove portion 20X is tapered in such a manner that a width of the groove portion 20X increases from the bottom surface of the groove portion 20X to an opening end portion of the groove portion 20X. As shown in FIGS. 10A and 10B, the inner wall surfaces of the groove portion 20X are inclined with respect to the upper surface of the board 21. Therefore, these modification examples in which the groove portion 20X has an approximately trapezoidal or U shape in cross section provide the same advantages as the advantages (1) to (7) of the exemplary embodiment.

Figure 10C:
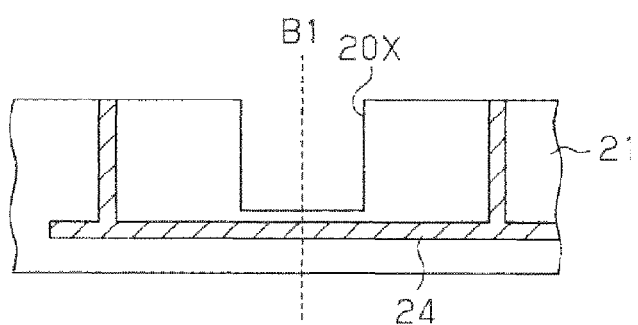

FIG. 10C shows the groove portion 20X having an approximately rectangle shape in cross section. This modification example provides the same advantages as at least the advantages (1) to (3) and (6) of the exemplary embodiment.

Figure 11:
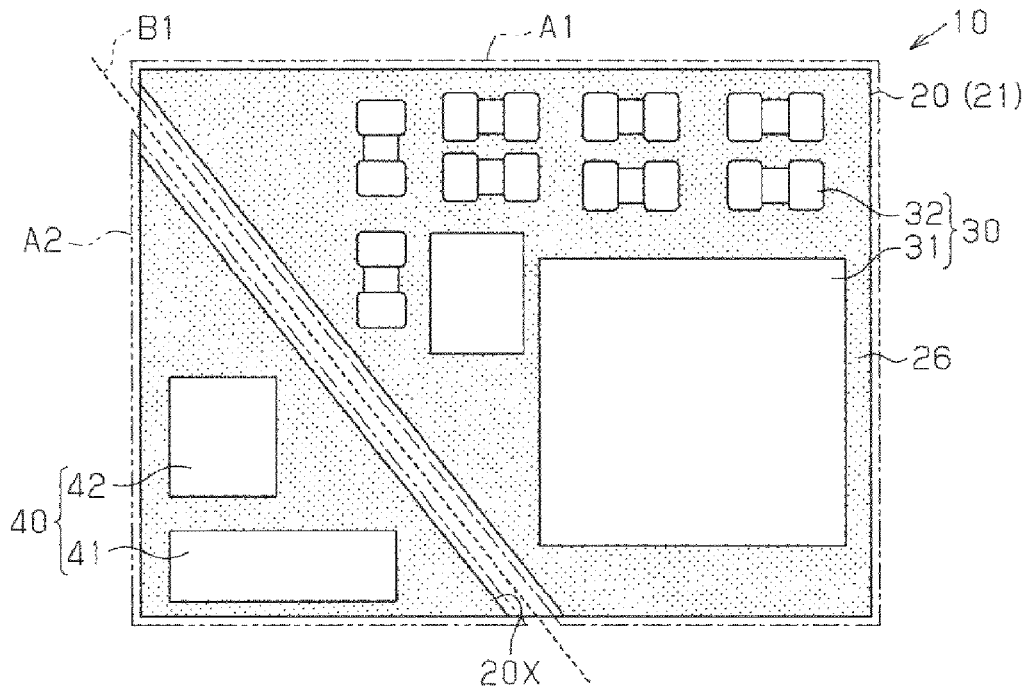
FIG. 11 is a schematic sectional view of a semiconductor device according to a seventh modification example.

The position where the non-product area A2 is formed and the shape of the non-product area A2 in a plan view are not limited to those in the exemplary embodiment. For example, FIG. 11 shows a non-product area A2 (enclosed by a two-dot chain line) at a corner portion of a wiring board 20 (board 21). The non-product area A2 has an approximately triangle shape in a plan view. In this modification example, a groove portion 20X is inclined with respect to the sides of the board 21 which is approximately rectangular in a plan view. As in the exemplary embodiment, this non-product area A2 is an area that is surrounded by the groove portion 20X and portions of the sides of the board 21. More specifically, this non-product area A2 is formed so as to include one corner of the board 21. This modification example having the above-described structure provides the same advantages as the advantages (1) to (7) of the exemplary embodiment. In addition, when the non-product area A2 is removed by cutting the semiconductor device 10 in the groove portion 20X, a semiconductor device 10A after the cutting (see a product area A1 enclosed by a chain line) has a asymmetrical shape in a plan view in both of the left-right direction and the top-bottom direction. Thus, the orientation of the semiconductor device 10A can be recognized easily.

Figure 12:
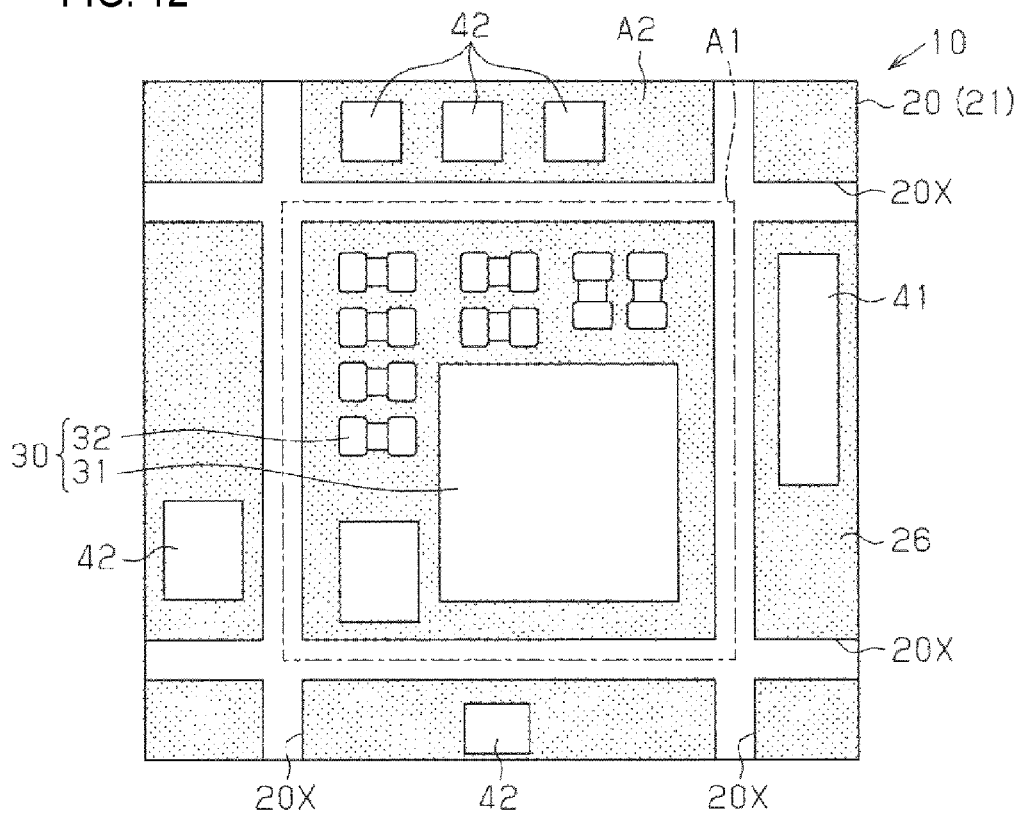
FIG. 12 is a schematic sectional view of a semiconductor device according to an eighth modification example.

FIG. 12 shows a non-product area A2 that has a frame-like shape in a plan view and that surrounds a product area A1 (enclosed by a chain line). In this modification example, the wiring board 20 is formed with plural groove portions 20X that makes up a grid shape in a plan view. This non-product area A2 is an area that is surrounded by the portions, indicated by the chain line, of the groove portions 20X which define the product area A1 and all of the sides of the board 21. This modification having the above-described structure provides the same advantages as the advantages (1) to (7) of the exemplary embodiment. In this modification example, a part of the groove portions 20X may be formed on the upper surface of the wiring board 20, and the remaining groove portions 20X may be formed on the lower surface of the wiring board 20.

As in the above modification examples, there are no particular limitations on the position of the non-product area A2 and the plan-view shape of the non-product area A2 so long as at least one of the plural sides that define the external shape of the non-product area A2 is a side(s) of the wiring board 20 and the remaining side(s) that define the external shape of the non-product area A2 is formed by the groove portion 20X.

In the exemplary embodiment and the above modification examples, each semiconductor device 10 is provided with a single non-product area A2. That is, a single non-product area A2 is provided for a single product area A1. However, the invention is not limited thereto. For example, plural non-product areas A2 may be provided for one product area A1. In the semiconductor device 10 shown in FIG. 12, if individual areas defined by the groove portions 20X are regarded as non-product areas A2, the wiring board 20 has eight non-product areas A2.

Figure 13:
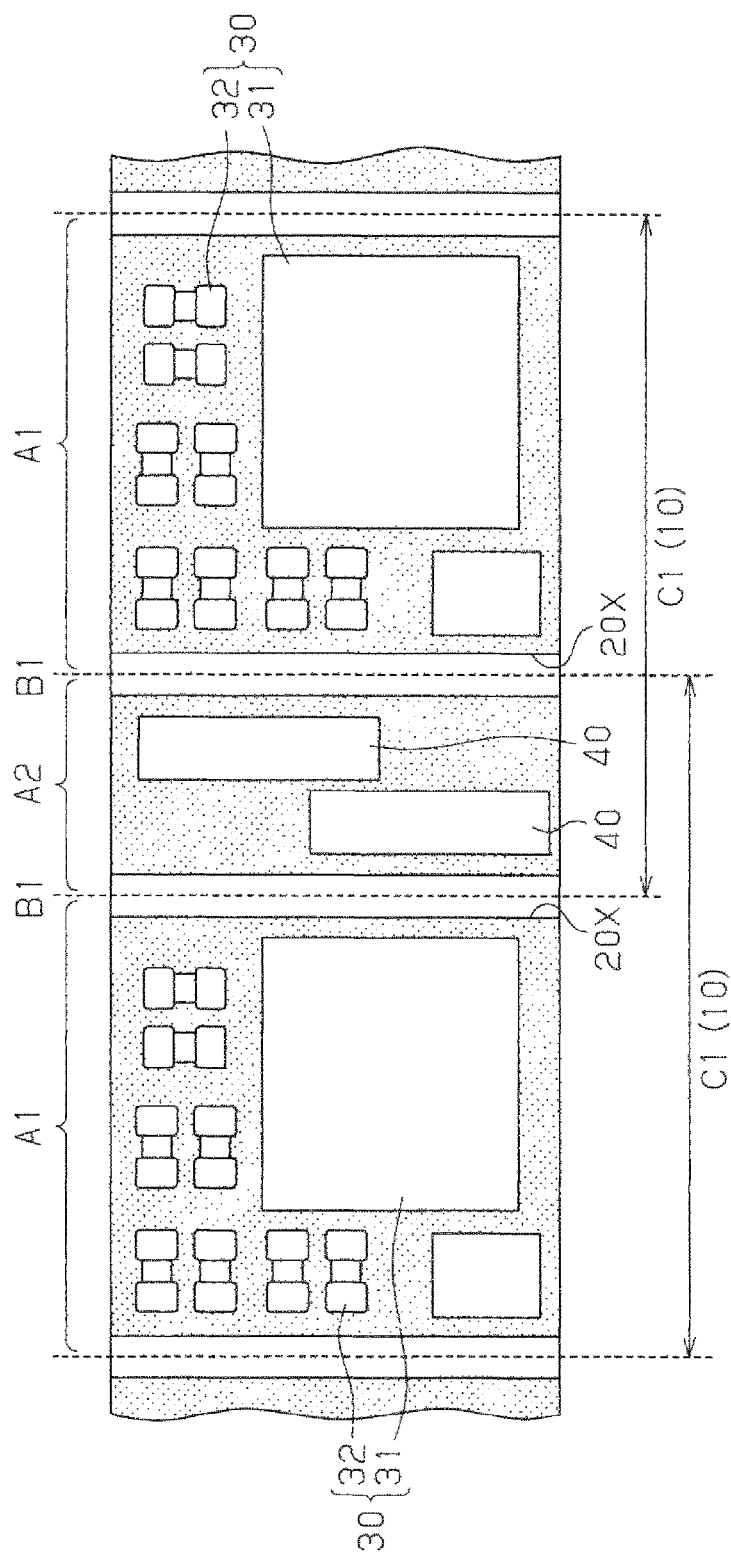
FIG. 13 is a schematic sectional view of a semiconductor device according to a ninth modification example.

As shown in FIG. 13, one non-product area A2 may be shared by plural (in FIG. 13, two) product areas A1 (i.e., semiconductor devices 10). In the modification example shown in FIG. 13, one non-product area A2 is shared by two adjacent product areas A1. A groove portion 20X is formed between the non-product area A2 and one of the adjacent product areas A1 (right-hand product area A1), and another groove portion 20X is formed between the non-product area A2 and the other of the adjacent product areas A1 (left-hand product area A1). An evaluation component 40 to be used in a firmware writing step and a characteristic evaluation step for the one product area A1 and another evaluation component 40 to be used in a firmware writing step and a characteristic evaluation step for the other product area A1 are mounted in the non-product area A2.

In the exemplary embodiment and the above modification examples, the opening portion 26Z of the solder resist layer 26 or the opening portion 27X of the solder resist layer 27 may be omitted. This modification example provides the same advantages as at least the advantages (1) to (5) of the exemplary embodiment.

In the exemplary embodiment and the above modification examples, the evaluation components 40 are mounted on the upper surface of the wiring board 20. However, the invention is not limited thereto. For example, the evaluation components 40 may be mounted on the lower surface of the wiring board 20. Alternatively, a part of the evaluation components 40 may be mounted on the upper surface of the wiring board 20, and the remaining evaluation components 40 may be mounted on the lower surface of the wiring board 20.

As shown in FIG. 3B, an electronic component(s) 30 may also be mounted on the lower surface of the wiring board 20.

In the exemplary embodiment and the above modification examples, the non-product area A2 may be removed by cutting the semiconductor device 10 at the boundary area by mechanical processing using a dicer, a router, or the like.

The exemplary embodiment is directed to the manufacturing method for producing multiple semiconductor devices 10 or 10A. Alternatively, the invention may be implemented as a method for producing a single semiconductor device 10 or 10A.

CLAUSES

This disclosure further encompasses various exemplary embodiments, for example, described below.

1. A method for manufacturing a semiconductor device, the method comprising:
preparing a wiring board including a product area, a non-product area, and a boundary area between the product area and the non-product area;
forming a groove portion in the wiring board in the boundary area;
after the forming the groove portion, mounting an electronic component in the product area and mounting an evaluation component in the non-product area;
writing information to the electronic component via the evaluation component; and
after the writing the information to the electronic component, separating the product area of the wiring board and the non-product area of the wiring board from each other at the groove portion.

What is claimed is:
1. A semiconductor device comprising:
a board including a product area, a non-product area, and a boundary area between the product area and the non-product area;
an electronic component that is mounted in the product area;
an evaluation component that is mounted in the non-product area, wherein a height dimension of the evaluation component is greater than that of the electronic component;
a wiring that electrically connects the electronic component and the evaluation component, the wiring including a wiring pattern formed on an upper surface or a lower surface of the board;
a groove portion that is formed in the boundary area of the board so as to overlap at least a part of the wiring in a plan view;
a first pad that is formed on the upper surface of the board in the product area and that is electrically connected to the electronic component;
a second pad that is formed on the upper surface of the board in the non-product area and that is electrically connected to the evaluation component;
a first solder resist layer that is laminated on the upper surface of the board; and
a second solder resist layer that is laminated on the lower surface of the board,
wherein
the non-product area is surrounded by the groove portion and at least a portion of sides of the board;
the groove portion extends from an upper surface of the first solder resist layer or a lower surface of the second solder resist layer to a position that is 50-75% through an entire thickness of the board in a thickness direction of the board;
one of the first and second solder resist layers which is not formed with the groove portion is formed with an opening portion that passes through the one of the first and second solder resist layers in a thickness direction of the one of the first and second solder resist layers, wherein the one of the first and second solder resist layers includes a first portion formed in the product area and a second portion formed in the non-product area, the first portion and the second portion of the one of the first and second solder resist layers being separated by the opening portion;
the opening portion overlaps an entirety of the groove portion in the plan view;
the wiring pattern is exposed through the opening portion formed in the one of the first and second solder resist layers; and
the surface of the board on which the wiring pattern is formed is opposite to a surface of the board which is formed with the groove portion.

2. The semiconductor device according to claim 1, wherein
the groove portion extends from the upper surface of the first solder resist layer to the position that is 50-75% through the entire thickness of the board in the thickness direction of the board, and
the wiring pattern is formed on the lower surface of the board.

3. The semiconductor device according to claim 1, wherein
the groove portion extends from the lower surface of the second solder resist layer to the position that is 50-75% through the entire thickness of the board in the thickness direction of the board, and
the wiring include a wiring pattern that is formed on the upper surface of the board.

4. The semiconductor device according to claim 3, wherein the first solder resist layer is formed with the opening portion.

5. The semiconductor device according to claim 1, wherein inner wall surfaces of the groove portion are slant surfaces.

6. The semiconductor device according to claim 1, wherein the non-product area includes one corner of the board and has a triangle shape in the plan view.

7. A semiconductor apparatus comprising:
a plurality of semiconductor devices, each of the plurality of semiconductor devices being the semiconductor device according to claim 1, wherein
the non-product area of each pair of adjacent semiconductor devices of the plurality of semiconductor devices is a common shared non-product area disposed between and separating the pair of adjacent semiconductor devices of the plurality of semiconductor devices.

\* \* \* \* \*